(12) United States Patent
Naganawa et al.

(10) Patent No.: US 9,330,880 B2
(45) Date of Patent: May 3, 2016

(54) ION IMPLANTATION DEVICE

(71) Applicant: LINTEC Corporation, Tokyo (JP)

(72) Inventors: Satoshi Naganawa, Tokyo (JP); Daisuke Goto, Tokyo (JP); Suguru Kenmochi, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 14/420,777

(22) PCT Filed: Sep. 12, 2013

(86) PCT No.: PCT/JP2013/074674
§ 371 (c)(1),
(2) Date: Feb. 10, 2015

(87) PCT Pub. No.: WO2014/046002
PCT Pub. Date: Mar. 27, 2014

(65) Prior Publication Data
US 2015/0206700 A1  Jul. 23, 2015

(30) Foreign Application Priority Data

Sep. 18, 2012 (JP) .................................. 2012-204941

(51) Int. Cl.
*G21K 5/04* (2006.01)
*H01J 37/04* (2006.01)
*C23C 14/48* (2006.01)
*H05H 1/46* (2006.01)
(Continued)

(52) U.S. Cl.
CPC ................. *H01J 37/04* (2013.01); *C23C 14/48* (2013.01); *C23C 14/562* (2013.01); *H01J 37/3171* (2013.01); *H01J 37/3277* (2013.01); *H01J 37/32412* (2013.01); *H05H 1/46* (2013.01); *H05H 2001/485* (2013.01)

(58) Field of Classification Search
USPC ................. 250/492.1, 492.2, 492.21, 492.22, 250/492.23, 492.3
See application file for complete search history.

(56) References Cited

U.S. PATENT DOCUMENTS

| 5,300,189 A | 4/1994 | Kokaku | |
| 2011/0189450 A1* | 8/2011 | Hoshi | B05D 3/00 428/215 |

FOREIGN PATENT DOCUMENTS

| JP | 61-116822 | 6/1986 |
| JP | 63-184926 | 7/1988 |

(Continued)

OTHER PUBLICATIONS

International Search Report, PCT/JP2013/074674, Oct. 22, 2013.
(Continued)

*Primary Examiner* — Nicole Ippolito
(74) *Attorney, Agent, or Firm* — Young & Thompson

(57) ABSTRACT

An ion implantation device equipped with a vacuum chamber (11), an electrode roll (13) on a portion of the outer circumferential part of which a film (2) is wound, a voltage application means (21) that applies a voltage to the electrode roll, and a gas introduction means (31) that introduces a gas into the vacuum chamber, wherein a voltage is applied to the electrode roll by means of the voltage application means and a gas is introduced by means of the gas introduction means, and an ion implantation process is performed on the surface of the film. In addition, electrode members (42) are provided opposing the surface of the electrode roll on which the film is wound.

14 Claims, 7 Drawing Sheets

(51) Int. Cl.
*H01J 37/32* (2006.01)
*C23C 14/56* (2006.01)
*H01J 37/317* (2006.01)
*H05H 1/48* (2006.01)

(56) References Cited

FOREIGN PATENT DOCUMENTS

| JP | 02-250953 | 10/1990 |
| JP | 2003-031398 | 1/2003 |
| JP | 2006-032810 | 2/2006 |
| JP | 2006-070238 | 3/2006 |
| JP | 2012-172261 | 9/2012 |

OTHER PUBLICATIONS

Chinese Office Action dated Dec. 22, 2015; Application No. 2013800426084.

* cited by examiner (1)

(2)

ION IMPLANTATION DEVICE

TECHNICAL FIELD

The present invention relates to an ion implantation apparatus.

BACKGROUND ART

Conventionally, a long continuous film is surface-modified through ion implantation. In one mode of the technique, while the film is conveyed toward one direction, ions in a plasma are implanted into the target surface of the film, to thereby form a gas barrier layer on, for example, the surface of the film (see, for example, Patent Document 1).

Patent Document 1 discloses an ion implantation apparatus for carrying out ion implantation. The ion implantation apparatus disclosed in Patent Document 1 includes, in the vacuum chamber thereof, rollers such as an unwind roller, a wind-up roller, and a roller electrode, and gas introduction means. The roller electrode is connected to voltage application means.

In the above ion implantation apparatus, an ion implantation gas is fed to the chamber. When a voltage is applied to the roller electrode by the voltage application means, an electric field is provided between the roller electrode and the chamber wall serving as a ground, to thereby form a plasma. Through application of negative DC high-voltage pulse, ions generated by the plasma are drawn to the roller electrode, whereby the ions are implanted into the surface of the film wound on the roller electrode.

PRIOR ART DOCUMENTS

Patent Documents

Patent Document 1: Japanese Patent Application Laid-Open (kokai) No. 2006-70238

SUMMARY OF THE INVENTION

Problems to be Solved by the Invention

In recent years, the film to be treated has become wider and wider, and the size of the roller electrode has increased, resulting in up-scaling of the ion implantation apparatus. When such a large-scale ion implantation apparatus is employed, the intensity of the electric field provided between the roller electrode and the chamber wall decreases due to a greater distance between the roller electrode and the chamber wall. That is, the electric field intensity is in inverse proportion to the interelectrode distance. When the intensity of the electric field provided between the roller electrode and the chamber wall decreases due to scaling-up of the ion implantation apparatus, the density of the formed plasma (the plasma density) decreases accordingly. In this case, a desired ion implantation treatment may fail to be attained, which is problematic.

One conceivable approach to elevate plasma density is application of higher voltage to the roller electrode. However, when this approach is employed, provision of an increased number of voltage sources for attaining high voltage elevates production cost, and the footprint and withstand voltage of the apparatus must be increased. Thus, this approach is not preferred.

Under such circumstances, an object of the present invention for solving the problems involved in the aforementioned conventional techniques is to provide an ion implantation apparatus which can enhance plasma density without employing an additional voltage source.

Means for Solving the Problems

The ion implantation apparatus of the present invention comprises:
a vacuum chamber,
a roller electrode having a portion of an outer circumferential part on which a film is wound,
voltage application means for applying a voltage to the roller electrode, and
gas introduction means for supplying a gas into the vacuum chamber,
in operation, voltage being applied to the roller electrode by the voltage application means, and the gas being supplied into the chamber through the gas introduction means, to thereby form a plasma, whereby a surface of the film is subjected to an ion implantation treatment,
wherein an electrode member is disposed so as to be opposite the portion of the roller electrode on which the film is wound.

According to the present invention, an electrode member is disposed so as to be opposite the portion of the roller electrode on which the film is wound, whereby an electric field is provided between the roller electrode and the electrode member. In this case, the field intensity of the provided electric field is higher than that of an electric field provided between the roller electrode and the inner wall of the vacuum chamber. As a result, plasma density is enhanced.

Preferably, the electrode member is arranged along a circumferential direction of the roller electrode. Through this configuration, an electric field having high field intensity can be uniformly formed along a circumferential direction of the roller electrode.

In one preferred embodiment of the present invention, the electrode member is composed of a plurality of plate members, and these plate members are arranged along a circumferential direction of the roller electrode, with respective members being separated from one another.

Also preferably, the electrode member is disposed so as to be opposite the entire of the roller electrode along the axial direction of the roller electrode. Through this configuration, an electric field having high field intensity can be uniformly formed along the axial direction of the roller electrode.

In a preferred mode, the voltage application means is configured to apply a voltage to an axial end of the roller electrode, and the electrode member is movable at a predetermined angle with respect to the axial direction of the roller electrode. When a voltage is applied to an axial end of the roller electrode, the voltage applied by the voltage application means drops, due to the intrinsic resistance of the roller electrode, from the voltage-applied end of the roller electrode to the opposite end thereof. In this case, the field intensity the roller electrode may vary in the axial direction thereof. However, according to the present invention, a uniform field intensity in the axial direction of the roller electrode can be realized by modifying the distance between the electrode member and the roller electrode.

Any end of the roller electrode is preferably provided with an extension member having the same diameter as that of the roller electrode. Through provision of such an extension member having the same diameter as that of the roller electrode, streams of the plasma around an end of the roller electrode can be suppressed, whereby uniform plasma density can be realized in the width direction of the roller electrode.

Effects of the Invention

The ion implantation apparatus of the present invention is advantageous and can enhance plasma density without employing an additional voltage source.

MODES FOR CARRYING OUT THE INVENTION

Embodiment 1

Embodiments of the present invention will next be described, with reference to FIGS. 1 and 2.

Figure 1:
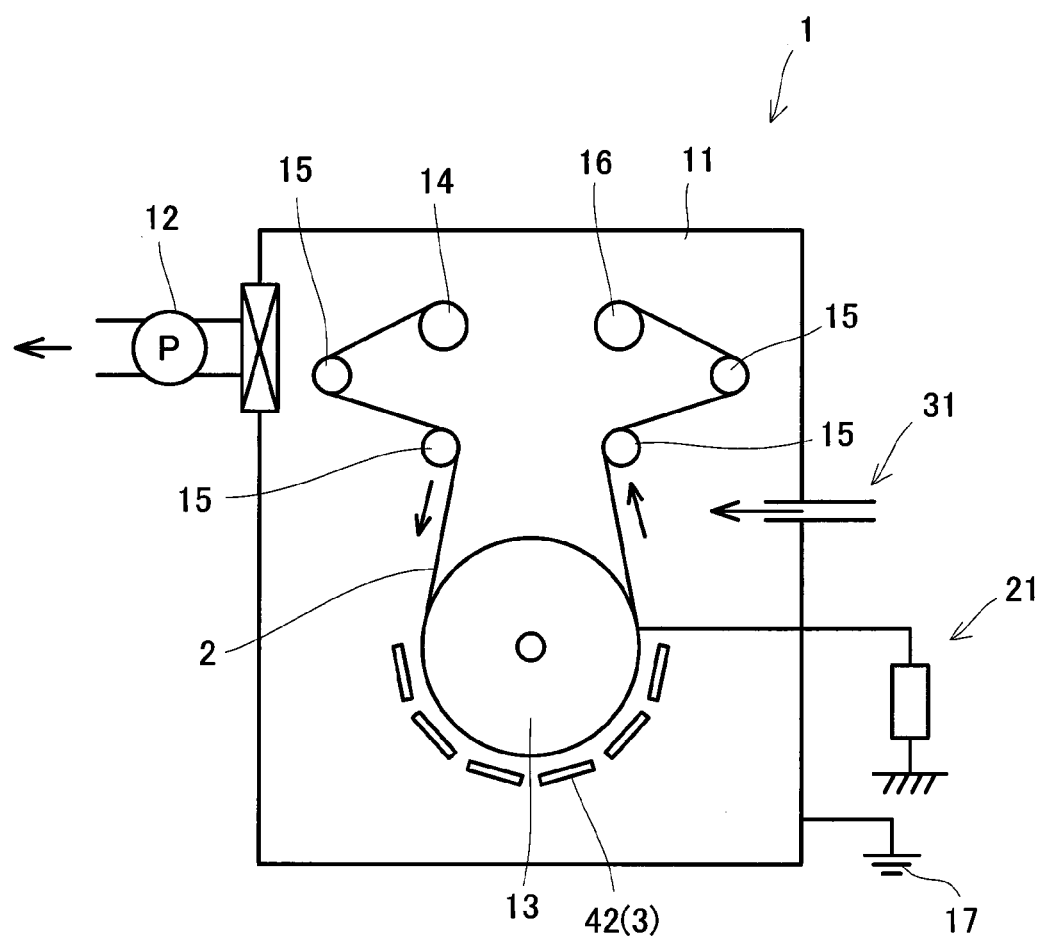
FIG. 1 A schematic view of an ion implantation apparatus according to Embodiment 1.
Figure 2:
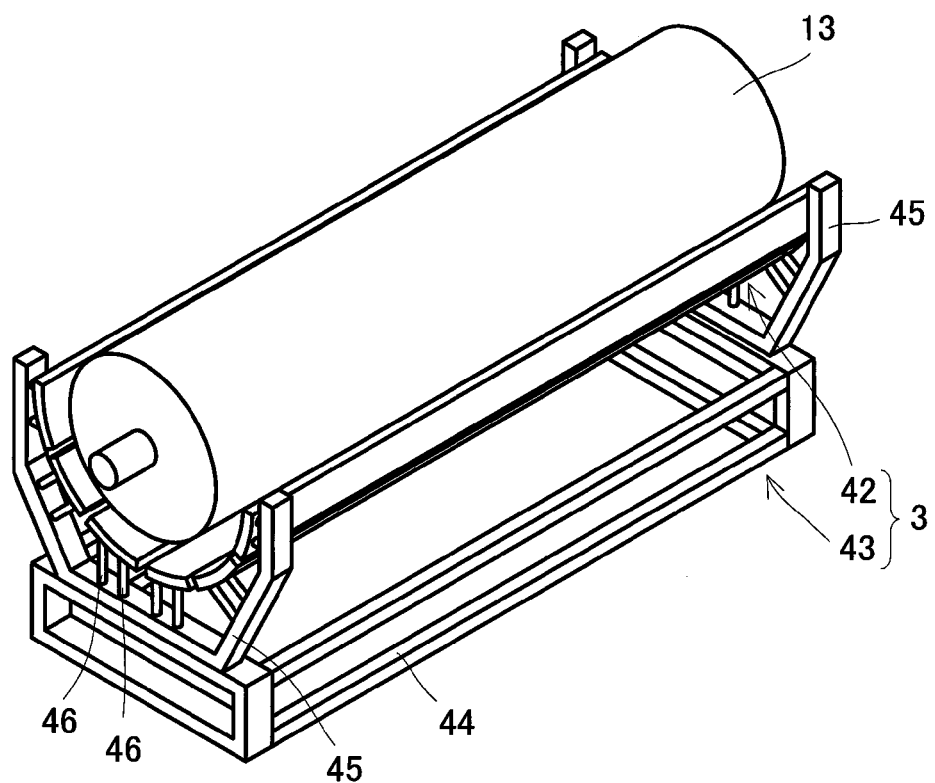
FIG. 2 A schematic perspective view of electrode members employed in the ion implantation apparatus according to Embodiment 1.

As shown in FIG. 1, an ion implantation apparatus 1 has a vacuum chamber 11. The vacuum chamber 11 is provided with exhaust means having a vacuum pump 12. The exhaust means is configured to provide the inside of the vacuum chamber 11 with a predetermined vacuum degree.

The vacuum chamber 11 is also provided with a roller electrode 13, an unwind roller 14, a plurality of conveying rollers 15, and a wind-up roller 16. On the bottom portion of the roller electrode 13, a film 2 which has been unwound by means of the unwind roller 14 and conveyed via one of the conveying rollers 15 is wound. The film 2 on the surface of the roller electrode 13 undergoes ion implantation treatment, details of which will be described hereinbelow, and is conveyed to a wind-up roller 16 via another one of the conveying rollers 15. In other words, the film present at the unwind roller 14 is not subjected to ion implantation treatment, and that present at the wind-up roller 16 has already been subjected to ion implantation treatment.

The roller electrode 13 is formed of a conductor. The roller electrode 13 is connected to voltage application means 21. The voltage application means 21 is configured to apply AC voltage or DC voltage to the roller electrode 13. Although not illustrated in FIG. 1, the voltage application means 21 is configured to apply voltage to an axial end of the roller electrode 13 so as to cause current to flow in the axial direction (width direction) of the roller electrode 13. Through application of voltage by the voltage application means 21, the roller electrode 13 works as an electrode.

Also, the vacuum chamber 11 is equipped with gas introduction means 31. The gas introduction means 31 has a gas source (not illustrated) and control means, whereby the flow rate of the gas fed by the gas source is controlled and the gas is supplied into the vacuum chamber 11.

In the vacuum chamber 11, there are provided, between the roller electrode 13 and the wall surface of the vacuum chamber 11, a counter electrode 3 which is composed of electrode members 42 and which is opposite the surface of the roller electrode 13 on which surface the film 2 is wound. As will be described hereinbelow, provision of the counter electrode 3 leads to formation of high-density plasma.

The structure of the counter electrode 3 will next be described with reference to FIG. 2.

The counter electrode 3 is composed of a plurality of electrode members 42. As shown in FIG. 2, the electrode members 42 are arranged along the circumferential direction of the roller electrode 13. The electrode members 42 are disposed on the floor of the vacuum chamber 11 and below the roller electrode 13, by the mediation of a support portion 43 which supports the electrode member 42.

The support portion 43 has a rectangular frame 44. The longitudinal direction of the frame 44 generally coincides with the axial direction of the roller electrode 13. At each longitudinal end of the frame 44, a support base 45 is disposed on the top surface of the frame. Each support base 45 is provided with a plurality of support members 46 separated from one another. The support members 46 are fixed to respective electrode members 42 at the ends thereof and support the electrode members 42 on each support base 45. No particular limitation is imposed on the shape or the like of the support portion 43, so long as the support portion can sustain the electrode members 42 and establish electrical connection of the electrode members 42 to the vacuum chamber 11.

The electrode members 42 have a plate-like form. Each electrode member 42 is opposite the surface of the roller electrode on which the film is wound, and the plurality of electrode members 42 are arranged along the circumferential direction of the roller electrode 13, with respective members being separated from one another.

The electrode members 42 are disposed along the axial direction of the roller electrode 13. The longitudinal length of each electrode member 42 generally coincides with the axial length of the roller electrode 13.

In Embodiment 1, six plate-like electrode members 42 are disposed to be opposite the lower portion of the surface of the roller electrode 13 on which surface the film 2 is wound. Each electrode member 42 is separated from the surface of the roller electrode 13 by a predetermined distance, and the plurality of electrode members 42 are separated from one another.

These electrode members 42 are formed of, for example, a metal such as iron, aluminum, or an alloy thereof, which can generally serve as an electrode material. In Embodiment 1, the employed electrode members 42 are formed of stainless steel (SUS), from the viewpoints of strength and production cost.

The thus-provided electrode members 42 are electrically connected to the vacuum chamber 11 by the mediation of the support portion 43. That is, the electrode members 42 are connected to a ground 17 (illustrated in FIG. 1) by the mediation of the vacuum chamber 11 and the support portion 43. Through this configuration, an electric field is provided between the roller electrode 13 and the electrode members 42 upon application of voltage.

Next will be described the ion implantation treatment performed by means of the ion implantation apparatus 1. The ion implantation treatment of the invention is defined as the process which includes implanting ions in a plasma into the surface of an object to thereby modify the surface, whereby an ion-implanted layer is formed.

Firstly, the film 2, an object to be treated, will be described. The film 2, which is a work of the treatment in Embodiment 1, is a polymer film. No particular limitation is imposed on the polymer film, and examples of the polymer include polyimide, polyamide, polyamide-imide, polyphenylene ether, polyether-ketone, polyether-ether-ketone, polyolefin, polyester, polycarbonate, polysulfone, polyether-sulfone, polyphenylene sulfide, polyarylate, acrylic resin, cycloolefin polymer, and aromatic polymer. Of these, polyester, polyamide, and cycloolefin polymer are preferred, with polyester and cycloolefin polymer being particularly preferred, since these polymer are often employed for forming a polymer film having a gas barrier property or the like and can provide an ion-implanted layer having a gas barrier property or the like. Examples of the polyester include polyethylene terephthalate, polybutylene terephthalate, polyethylene naphthalate, and polyarylate. In the present invention, the film 2 (i.e., a treatment work) is not limited to the aforementioned polymer films. The film 2 may be a laminate film formed of a polymer film and, stacked thereon, a layer containing a material which exhibits a gas barrier property through ion implantation (e.g., a silicon-containing polymer such as polysilazane or polyorganosiloxane).

No particular limitation is imposed on the thickness of the film 2. From the viewpoints of ease of winding and application of the film, the thickness is generally 1 to 1,000 μm, preferably 5 to 500 μm, more preferably 10 to 200 μm.

In a specific procedure, the ion implantation apparatus is activated. First, the chamber is evacuated by the exhaust means, to thereby control the inside pressure of the vacuum chamber 11 to $5.0 \times 10^{-3}$ Pa or lower.

After the inside pressure of the vacuum chamber 11 has been adjusted to a constant value falling within the aforementioned range, an ion implantation gas is supplied to the vacuum chamber 11 through the gas introduction means 31.

Examples of the ion implantation gas to be supplied include non-metallic gases such as water, hydrogen, nitrogen, and oxygen; rare gases such as argon, helium, and fluorocarbon; and ions of conductive metals such as gold, silver, copper, platinum, nickel, and aluminum. Of these, rare gases and non-metallic ions are preferred, since they can be ion-implanted in a simpler manner, to thereby efficiently produce a film having a favorable gas barrier property or the like. Among these preferred species, nitrogen, oxygen, argon, and helium are more preferred, with argon being particularly preferred, since they can be appropriately and conveniently selected in response to the purpose of surface treatment.

The flow rate of supplied gas is 10 to 2,000 sccm, preferably 100 to 1,000 sccm. When the flow rate satisfies the conditions, a plasma of interest can be formed. The inside pressure of the vacuum chamber 11 upon supply of the gas is about $1.0 \times 10^{-4}$ to about 1.0 Pa, preferably about $1.0 \times 10^{-2}$ to about $1.0 \times 10^{-1}$ Pa.

Under these conditions, the film 2 is conveyed via the unwind roller 14, the conveying roller 15, and the roller electrode 13, to the wind-up roller 16. No particular limitation is imposed on the speed of winding the film 2, and the winding speed is generally 0.5 to 20 m/min.

Then, an AC voltage is applied to the roller electrode 13 by the voltage application means 21, whereby a plasma is generated. No particular limitation is imposed on the frequency of the applied AC voltage, and the frequency is generally 500 to 5,000 Hz. No particular limitation is imposed on the applied electric power, and it is generally 500 to 10,000 W. Under these conditions, a plasma can be consistently generated.

Also, a DC voltage is applied to the roller electrode 13 by the voltage application means 21. The DC voltage is, for example, −1 kV to −50 kV, more preferably −3 kV to −30 kV, particularly preferably −5 kV to −20 kV. When the applied DC voltage is higher than −1 kV, ions are not readily drawn, to thereby encounter difficulty in formation of an ion-implanted layer having sufficient gas barrier property or the like, whereas when the DC voltage is lower than −50 kV, an X-ray is generated, which is not preferred in production of the surface modified film.

Through the aforementioned procedure, an electric field is provided between the electrode members 42 and the roller electrode 13, to thereby form a plasma. Positive ions in the thus-formed plasma are drawn to the roller electrode 13 by application of the negative voltage, whereby the ions are implanted into the surface of the film 2 wound on the roller electrode 13. Thus, ions are implanted into the surface of the film 2. Notably, when no electrode member 42 is provided, the wall of the chamber serves as an electrode. In this case, an electric field is provided between the roller electrode 13 and the chamber wall.

In Embodiment 1, the electrode members 42 are disposed below and along a circumferential direction of the roller electrode 13. Thus, the electric field generated between the roller electrode 13 and the electrode members 42 is greater than that generated between the roller electrode 13 and the chamber wall, since the electric field intensity is in inverse proportion to the interelectrode distance. Furthermore, in Embodiment 1, since the field intensity between the roller electrode 13 and the electrode members 42 becomes great, the plasma density between the two types of electrodes can be enhanced.

Particularly, since the longer side of each electrode member 42 disposed along the width direction of the roller electrode 13 is equivalent to the axial length of the roller electrode 13, the distance between the electrode member 42 and the surface of the roller electrode 13 is constant along the axial direction. In this configuration, the provided electric field is uniform along the axial direction of the roller electrode 13 and has high field intensity. Thus, a plasma can be generated in such a manner that the plasma density along the axial direction of the roller electrode 13 is enhanced and uniform.

Also, since the electrode members 42 are arranged along the circumferential direction of the roller electrode 13, the distance between each of the electrode members 42 and the roller electrode 13 is constant in the circumferential direction. In this configuration, the provided electric field roller electrode 13 has a high field intensity which is uniform along the circumferential direction. Thus, a plasma can be generated in such a manner that the plasma density along the circumferential direction of the roller electrode 13 is enhanced and uniform.

As described above, in the ion implantation apparatus according to Embodiment 1, provision of the electrode members 42 below the roller electrode 13 enhances plasma density, and a plasma of interest can be provide without employing an additional voltage source. As a result, more effective ion implantation can be performed.

In Embodiment 1, the plurality of electrode members 42 are arranged along the circumferential direction so that they are separated from one another. However, the configuration mode is not limited thereto. Thus, the electrode member 42 may be a single plate-like member which is curved along the circumferential direction of the roller electrode 13 and which is separated from a constant distance from the roller electrode 13. Also, in Embodiment 1, the plurality of electrode members 42 are arranged along the circumferential direction so that they are separated from one another. Alternatively, each electrode member 42 is fragmented along the axial direction of the roller electrode 13, and the electrode members 42 are separated a constant distance from the roller electrode 13.

Embodiment 2

An ion implantation apparatus 1A according to Embodiment 2 of the invention differs from the ion implantation apparatus of Embodiment 1, in that the angle of each electrode member 42A with respect to the axial direction may be adjusted.

Figure 3:
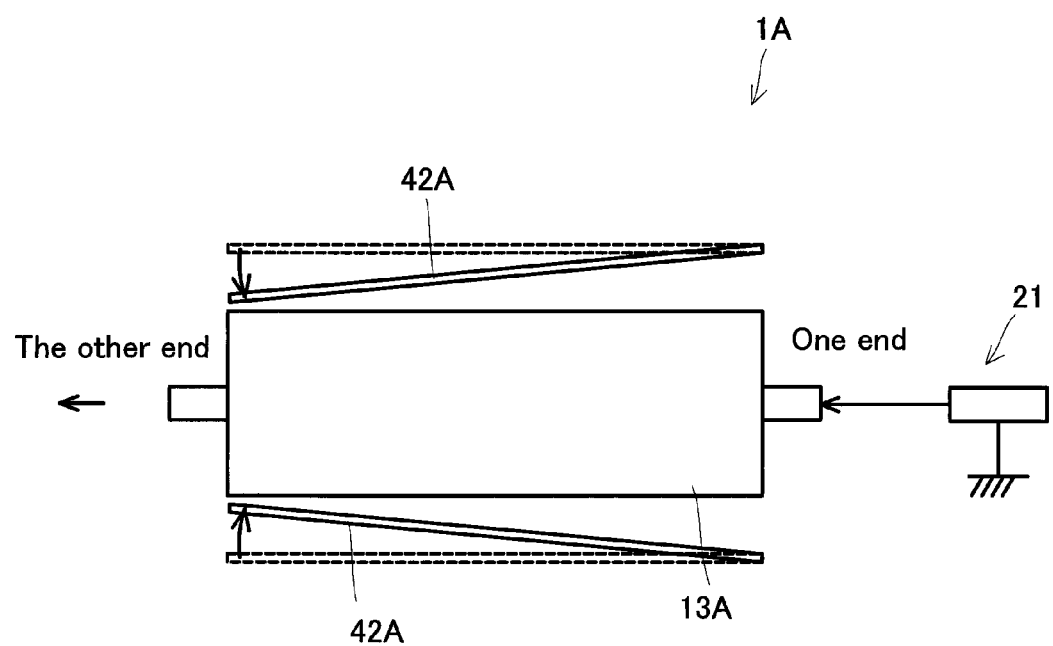
FIG. 3 A schematic view of electrode members employed in the ion implantation apparatus according to Embodiment 2.

As shown in FIG. 3, in the ion implantation apparatus 1A of Embodiment 2, the disposition angle of each electrode member 42A is variable. Specifically, the distance between the electrode member 42A and the roller electrode 13A may be varied in the axial direction of the roller electrode 13A.

To the roller electrode 13A, a voltage is applied through the voltage application means 21. In this case, the voltage is applied to one end of the roller electrode 13A. The voltage applied to the roller electrode 13A drops, due to an intrinsic resistance of the roller electrode 13A, from the voltage application end to the other axial end of the roller electrode 13A. Due to the drop in voltage, the intensity of the electric field provided between the roller electrode 13A and the electrode members 42A may conceivably decrease from the voltage application end to the other axial (longitudinal) end of the roller electrode 13A. If this drop occurs, the plasma density on the surface the film 2 along the axial direction becomes non-uniform. Thus, prevention of voltage drop is preferred.

In order to solve the problem, in Embodiment 2, any of the angle of the electrode members 42A; i.e., the distance between the electrode member 42A and the roller electrode 13A, is modified, to thereby attain a uniform field intensity of the electric field provided along the axial direction of the roller electrode 13A. Specifically, the distance between the voltage application end of the roller electrode 13A and the electrode member 42A is adjusted to the same value as employed in Embodiment 1, and the distance between the other axial end of the roller electrode 13A and the electrode member 42A is reduced. Through this configuration, the field intensity of the electric field provided along the axial direction of the roller electrode 13A can be adjusted to be uniform.

Next will be described a specific mechanism which can adjust the angle of the electrode member 42A in response to the field intensity of the roller electrode 13A.

Figure 4:
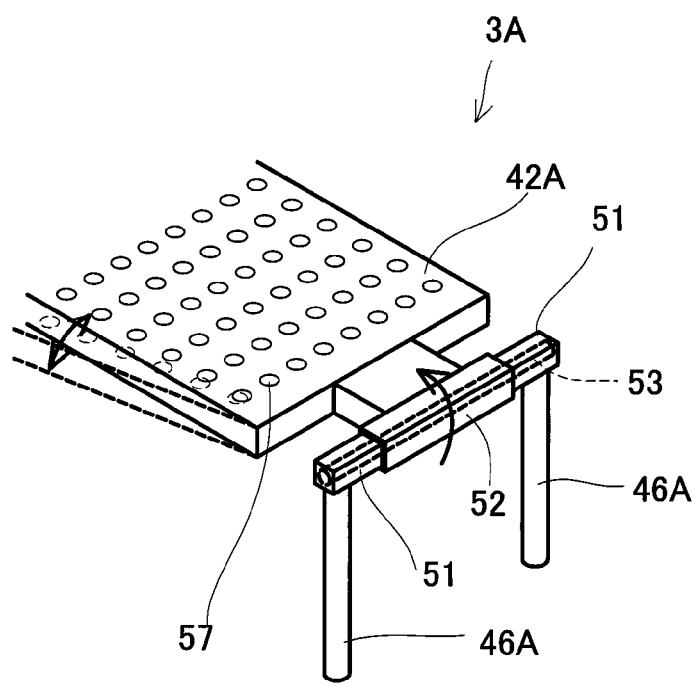
FIG. 4 A schematic view of an electrode member employed in the ion implantation apparatus according to Embodiment 2.
Figure 4:
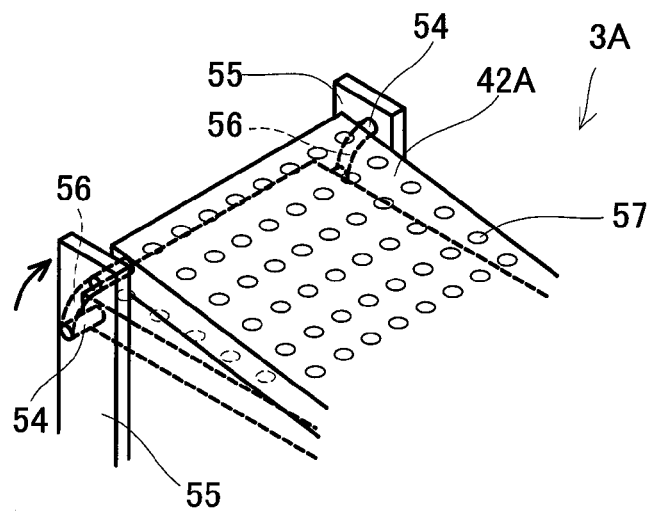

FIG. 4(1) shows the structure of one end of the electrode member 42A in the longitudinal direction (corresponding to the end of the roller electrode 13), and FIG. 4(2) shows the structure of the other end of the electrode member 42A in the longitudinal direction (corresponding to the other end of the roller electrode 13).

As shown in FIG. 4(1), in Embodiment 2, each support member 46A is not directly fixed to the electrode member 42A, but is connected to a columnar member 51. A rotating part 52 is provided between two columnar members 51. The rotating part 52 holds a rotation axis 53 thereinside, and each end of the rotation axis 53 is rotatably supported in the columnar member 51. The rotating part 52 is rotated about the rotation axis 53.

To the rotating part 52, one end surface of the electrode member 42A is connected. Thus, when the rotating part 52 is rotated, the end of the electrode member 42A is rotated about the rotating part 52 serving as a rotation axis. That is, the electrode member 42A is configured to be able to swing about the rotation axis 53.

Meanwhile, as shown in FIG. 4(2), the other end of the electrode member 42A is configured to move in response to the electrode member 42A which swings about the rotation axis 53. Specifically, the electrode member 42A has, at the other end thereof, pins 54 which outwardly protrude from the longitudinal end of the electrode member 42A. Also, a pair of guide members 55 are disposed. Each inside surface of the guide member plate is provided with a guide 56. The pins 54 are inserted into the guides 56 and are movable along the guides 56. When one end of the electrode member 42A swings about the rotation axis 53, the other end of the electrode member 42A is moved in response to the movement of the pins 54 guided by the guides 56. Through this mechanism, the angle of the electrode member 42A is varied.

Thus, in Embodiment 2, the electrode member 42A is configured such that the electrode member 42A swings about the rotation axis 53 provided at one end of the electrode member 42A, and the other end of the electrode member 42A is guided in response to the swing, whereby the disposition angle of the electrode member 42A can be modified.

In Embodiment 2, the disposition angle of each electrode member 42A along the longitudinal direction can be modified. In this case, the field intensity of the roller electrode 13A along the axial direction is maintained at a constant value. Thus, a uniform plasma density can be maintained between the roller electrode 13A and the electrode members 42A along the axial direction of the roller electrode 13A. Therefore, according to the ion implantation apparatus of Embodiment 2, a desired ion implantation treatment can be realized.

In Embodiment 2, the electrode member 42A is provided with holes 57. By virtue of the holes, the weight of the electrode member 42A can be reduced, without affecting the provided electric field, and modification of the disposition angle of the electrode member 42A can be facilitated.

Notably, the mechanism of Embodiment 2 for modifying the angle of the electrode member 42A is not limited thereto, and any mechanism may be employed, so long as it can vary the disposition angle of the electrode member 42A.

Embodiment 3

Embodiment 3 differs from Embodiment 1, in that a roller electrode 13B is elongated in the longitudinal direction.

Figure 5:
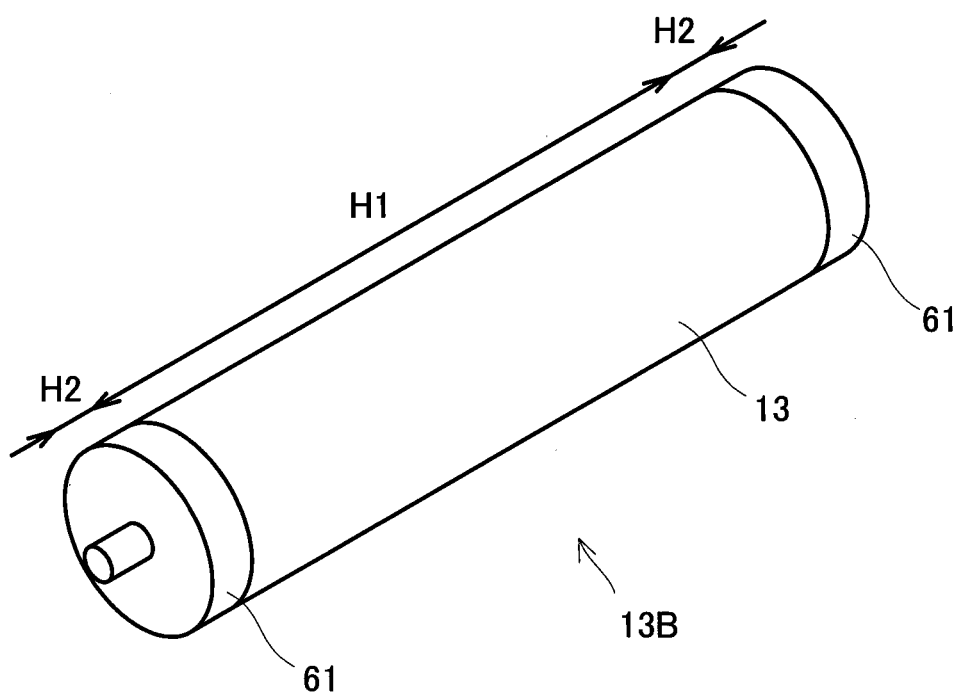
FIG. 5 A schematic view of a roller electrode employed in the ion implantation apparatus according to Embodiment 3.

As shown in FIG. 5, in Embodiment 3, the elongated roller electrode 13B is formed by appending an extension member 61 to each end of the same roller electrode 13 as employed in Embodiment 1. The extension member 61 has the same diameter as that of the roller electrode 13 and is joined to each end of the roller electrode 13. As a result, the original length H1 of the roller electrode 13 in the axial direction increases by 2×H2 (H2: length of the extension member). The length of the roller electrode 13B is H1+2×H2. The extension member 61 may be formed of, for example, a metal such as iron, aluminum, or an alloy thereof, which can generally serve as an electrode material. In Embodiment 3, SUS is used, from the viewpoints of strength and production cost.

Through provision of the extension member 61, streams of the plasma around an end of the roller electrode 13 can be prevented, whereby uniform ion implantation can be realized in the width direction of the film.

In other words, when the axial length of the roller electrode 13 is generally the same as that of the film, in the case where streams of the plasma occurs around an end of the roller electrode 13, the plasma density at the end of the film decreases, possibly failing to attain intended ion implantation at the end of the film. In Embodiment 3 for solving the problem, an extension member is joined to each end of the roller electrode 13, whereby the film can be exposed to a uniform plasma over the entire width thereof. Thus, the entire width of the film can undergo uniform ion implantation.

Example 1

Figure 6:
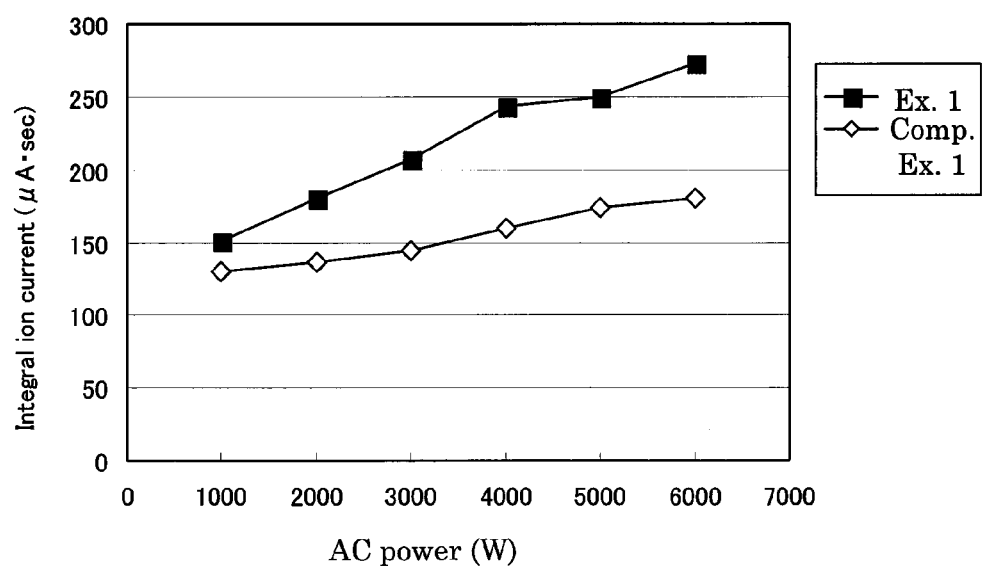
FIG. 6 A graph showing the results of Example 1 and Comparative Example 1.

In Example 1, a film (polyethylene terephthalate, thickness: 25 μm, T-100, product of Mitsubishi Plastics, Inc.) was subjected to ion implantation by means of an ion implantation apparatus shown in FIG. 1, under the following conditions: vacuum chamber internal pressure, 0.5 Pa; ion implantation gas, argon; gas flow rate, 600 sccm; DC voltage, −6 kV; and AC voltage frequency, 2,000 Hz. While the distance between the roller electrode 13 and each electrode member 42 was maintained at 60 mm (a constant distance), ion implantation was performed under variation in AC power, and the integral ion current was measured by means of an oscilloscope (DLM 2022, product of Yokogawa Electric Corporation). FIG. 6 shows the results.

Example 2

Figure 7:
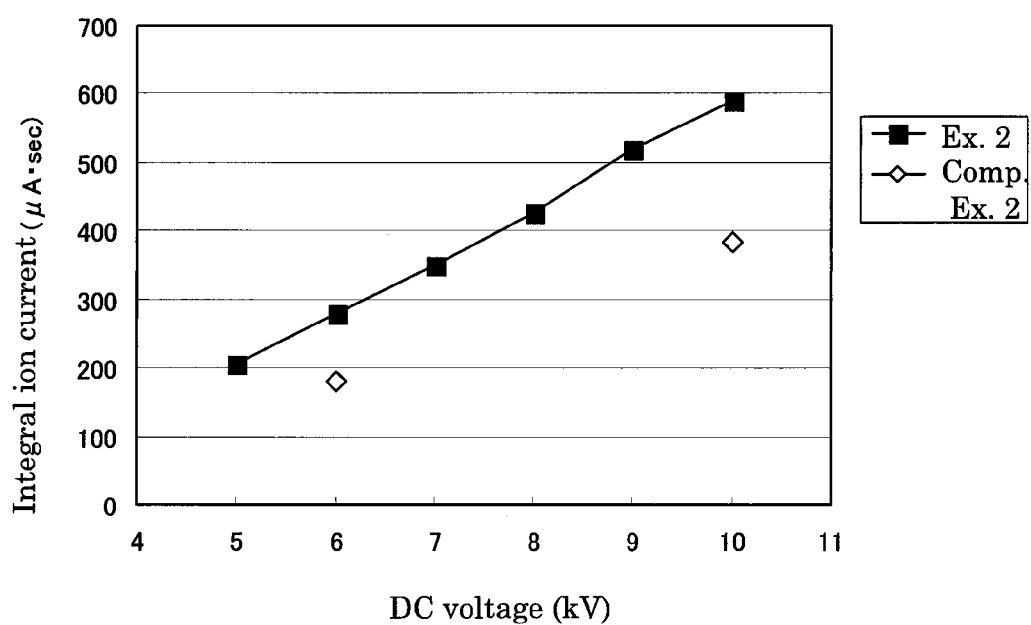
FIG. 7 A graph showing the results of Example 2 and Comparative Example 2.

The procedure of Example 1 was repeated, except that the AC power was constantly adjusted to 6,000 W, and the DC voltage was varied from 4 to 10 kV. The integral ion current was measured under the same conditions as employed in Example 1. FIG. 7 shows the results.

Comparative Example 1

The procedure of Example 1 was repeated, except that ion implantation was performed by means of a conventional ion implantation apparatus having no electrode member. The integral ion current was measured under the same conditions as employed in Example 1. FIG. 6 shows the results.

Comparative Example 2

The procedure of Example 2 was repeated, except that ion implantation was performed by means of a conventional ion implantation apparatus having no electrode member. The integral ion current was measured under the same conditions as employed in Example 2. FIG. 7 shows the results.

In the present invention, the integral ion current is defined as an integrated area of current waves measured per pulse. The integral ion current correlates to the provided plasma. Specifically, the greater the integral ion current, the higher the plasma density.

As shown in FIG. 6, the integral ion current was greater in Example 1 than in Comparative Example 1 at all the tested AC powers. Therefore, provision of electrode members as employed in Example 1 was found to enhance the plasma density.

As shown in FIG. 7, the integral ion current was greater in Example 2 than in Comparative Example 2 at all the tested DC voltages. Therefore, provision of electrode members as employed in Example 2 was found to enhance the plasma density.

Thus, the tests of Examples 1 and 2 have revealed that provision of such an electrode member can enhance the plasma density.

In the aforementioned embodiments, the field intensity along the axial direction of the roller electrode 13 was adjusted to be uniform by changing the disposition angle of each electrode member 42. However, the method is not limited to this technique. For example, in an alternative configuration, electrode members which are separated from one another are disposed along the axial direction of the roller electrode 13, and different voltages are applied to respective electrode members, whereby the field intensity along the axial direction of the roller electrode 13 is adjusted to be uniform.

DESCRIPTION OF REFERENCE NUMERALS 1, 1A . . . ion implantation apparatus
2 . . . film
3 . . . counter electrode
11 . . . vacuum chamber
12 . . . vacuum pump
13, 13A, 13B . . . roller electrode
14 . . . unwind roller
15 . . . conveying roller
16 . . . wind-up roller
17 . . . ground
21 . . . voltage application means
31 gas introduction means
42, 42A . . . electrode member
43 . . . support member
44 . . . frame
45 . . . support base
46, 46A . . . support member
51 . . . columnar member
52 . . . rotating part
53 . . . rotation axis
54 . . . pin
55 . . . guide member
56 . . . guide
57 . . . hole
61 . . . extension member

The invention claimed is:

1. An ion implantation apparatus comprises:
a vacuum chamber,
a roller electrode having a portion of an outer circumferential part on which a film is wound,
voltage application means for applying a voltage to the roller electrode, and
gas introduction means for supplying a gas into the vacuum chamber,
in operation, voltage being applied to the roller electrode by the voltage application means, and the gas being supplied into the chamber through the gas introduction means, to thereby form a plasma, whereby a surface of the film is subjected to an ion implantation treatment,
wherein an electrode member is disposed so as to be opposite the portion of the roller electrode on which the film is wound, and
the electrode member is composed of a plurality of plate members, and the plate members are arranged along a circumferential direction of the roller electrode, with respective members being separated from one another.

2. The ion implantation apparatus according to claim 1, wherein the electrode member is disposed so as to be opposite the entire of the roller electrode along the axial direction of the roller electrode.

3. The ion implantation apparatus according to claim 2, wherein the voltage application means is configured to apply a voltage to an axial end of the roller electrode, and the electrode member is movable at a predetermined angle with respect to the axial direction of the roller electrode.

4. The ion implantation apparatus according to claim 2, wherein an end of the roller electrode is provided with an extension member having the same diameter as that of the roller electrode.

5. The ion implantation apparatus according to claim 2, wherein the electrode member is provided with a hole.

6. The ion implantation apparatus according to claim 1, wherein the voltage application means is configured to apply a voltage to an axial end of the roller electrode, and the electrode member is movable at a predetermined angle with respect to the axial direction of the roller electrode.

7. The ion implantation apparatus according to claim 6, wherein an end of the roller electrode is provided with an extension member having the same diameter as that of the roller electrode.

8. The ion implantation apparatus according to claim 1, wherein an end of the roller electrode is provided with an extension member having the same diameter as that of the roller electrode.

9. The ion implantation apparatus according to claim 1, wherein the electrode member is provided with a hole.

10. An ion implantation apparatus comprises:
   a vacuum chamber,
   a roller electrode having a portion of an outer circumferential part on which a film is wound,
   voltage application means for applying a voltage to the roller electrode, and
   gas introduction means for supplying a gas into the vacuum chamber,
   in operation, voltage being applied to the roller electrode by the voltage application means, and the gas being supplied into the chamber through the gas introduction means, to thereby form a plasma, whereby a surface of the film is subjected to an ion implantation treatment,
   wherein an electrode member is disposed so as to be opposite the portion of the roller electrode on which the film is wound, and
   the electrode member is disposed so as to be opposite the entire of the roller electrode along the axial direction of the roller electrode.

11. The ion implantation apparatus according to claim 10, wherein the electrode member is arranged along a circumferential direction of the roller electrode.

12. The ion implantation apparatus according to claim 10, wherein the voltage application means is configured to apply a voltage to an axial end of the roller electrode, and the electrode member is movable at a predetermined angle with respect to the axial direction of the roller electrode.

13. The ion implantation apparatus according to claim 10, wherein an end of the roller electrode is provided with an extension member having the same diameter as that of the roller electrode.

14. The ion implantation apparatus according to claim 10, wherein the electrode member is provided with a hole.

* * * * *